(12) United States Patent
Kim

(10) Patent No.: US 7,916,560 B2
(45) Date of Patent: Mar. 29, 2011

(54) SEMICONDUCTOR MEMORY DEVICE

(75) Inventor: Kwi-Dong Kim, Kyoungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 446 days.

(21) Appl. No.: 12/165,171

(22) Filed: Jun. 30, 2008

(65) Prior Publication Data
US 2009/0016125 A1 Jan. 15, 2009

(30) Foreign Application Priority Data

Jul. 12, 2007 (KR) ........................ 10-2007-0070054

(51) Int. Cl.
*G11C 7/00* (2006.01)
(52) U.S. Cl. ..................................... 365/194; 365/233.1
(58) Field of Classification Search .................. 365/194, 365/233.1, 201
See application file for complete search history.

(56) References Cited

U.S. PATENT DOCUMENTS
4,320,508 A * 3/1982 Takezoe ............................ 714/4

FOREIGN PATENT DOCUMENTS
KR 2007-0036473 4/2007

\* cited by examiner

*Primary Examiner* — Vu A Le
(74) *Attorney, Agent, or Firm* — IP & T Group LLP

(57) ABSTRACT

A semiconductor memory device can determine whether control for supplying termination resistances is normally performed or not by applying a test signal. The device includes a termination resistance driving controller configured to receive a plurality of termination resistance setting signals in synchronization with an external clock and a delay locked loop (DLL) clock to output a plurality of pre-driving signals and a plurality of termination resistance driving signals for a predetermined time. A data pre-driver is configured to output data in synchronization with the external clock. A test driving detector is configured to drive output nodes to a predetermined voltage level in response to a test signal and the plurality of pre-driving signals. A data output buffer is configured to apply termination resistances corresponding to the plurality of termination resistance driving signals to input/output pads, and output the data from the output nodes to the input/output pads.

17 Claims, 6 Drawing Sheets

SEMICONDUCTOR MEMORY DEVICE

CROSS-REFERENCE TO RELATED APPLICATION

The present invention claims priority of Korean patent application number 10-2007-0070054, filed on Jul. 7, 2007, which is incorporated by reference in its entirety.

BACKGROUND OF THE INVENTION

The present invention relates to a semiconductor memory device, and more particularly to a semiconductor memory device capable controlling a supply of termination resistances.

Semiconductor devices are implemented into integrated circuit (IC) chips such as central processing units (CPUs), memories, and gate arrays, and are incorporated into a variety of electrical products such as personal computers, servers and workstations. Most of semiconductor devices include an input circuit configured to receive signals from an outside world via input pads and an output circuit configured to provide internal signals to the outside world via output pads.

As the operating speed of the electrical products is increasing, a swing width of a signal interfaced between the semiconductor devices is being gradually reduced for minimizing a delay time taken for signal transmission. However, the reduction in the swing width of the signal makes the signal easily exposed to external noise, causing the signal reflectance to become more critical at an interface terminal due to impedance mismatch. Such impedance mismatch is generally caused by external noise, a variation of a power supply voltage, a change in an operating temperature, a change in a manufacturing process, etc. The impedance mismatch may lead to a difficulty in high-speed transmission of data and distortion of output data. Therefore, if semiconductor devices receive the distorted output signal through an input terminal, it frequently gives rise to problems such as a setup/hold failure and an error in decision of an input level.

In particular, in order to resolve the above problems, a semiconductor memory device requiring high-speed performance employs an impedance matching circuit, which is called an on-chip termination device or an on die termination (ODT) device, near an input pad inside an IC chip. In a typical ODT scheme, source termination is performed at a transmitting end by an output circuit, and parallel termination is performed by a termination circuit connected in parallel with respect to an input circuit.

FIG. 1 is a block diagram of a conventional semiconductor memory device with an ODT device.

Referring to FIG. 1, the conventional semiconductor memory device includes an ODT driving controller 10, a data pre-driver 20, and a data output buffer 30. The ODT driving controller 10 receives a plurality of ODT setting signals ODT1, ODT2 and ODT3 in synchronization with an external clock CLK and a delay lock loop (DLL) clock RDLLCLK to output a plurality of ODT driving signals ENODT1, ENODT2 and ENODT3 for a predetermined time. The data pre-driver 20 receives falling data DT_F and rising data DT_R to output pull-up data DT_UP and pull-down data DT_DN in synchronization with an external falling clock FCLK and an external rising clock RCLK. The data output buffer 30 applies termination resistances corresponding to the ODT driving signals ENODT1, ENODT2 and ENODT3 into corresponding pads, and drives data corresponding to the pull-up data DT_UP and the pull-down data DT_DN to corresponding pads.

The ODT driving controller 10 includes an input detecting unit 11, a termination determining unit 13, a DLL clock supplying unit 15, a driving signal generating unit 17, and a signal outputting unit 19. The input detecting unit 11 receives the ODT setting signals ODT1, ODT2 and ODT3 and the external clock CLK to generate a period entry signal ODTENB and a driving clock CLKODT. The termination determining unit 13 counts the driving clock CLKODT for a predetermined time in response to the activation of the period entry signal ODTENB to generate a period close signal CLKODTB. The DLL clock supplying unit 15 supplies a plurality of delayed DLL clocks RCLKDLP10, RCLKDLP20, FCLKDLP15 and FCLKDLP25 in response to the period entry signal ODTENB and interrupts the supply of the delayed DLL clocks RCLKDLP10, RCLKDLP20, FCLKDLP15 and FCLKDLP25 in response to the period close signal CLKODTB. The driving signal generating unit 17 receives the ODT setting signals ODT1, ODT2 and ODT3 in synchronization with the external clock CLK in response to the activation of an external ODT signal ODT, and outputs a plurality of pre-driving signals ODTLAT1, ODTLAT2 and ODTLAT3 in synchronization with the delayed DLL clocks RCLKDLP10, RCLKDLP20, FCLKDLP15 and FCLKDLP25. The signal outputting unit 19 drives the pre-driving signals ODTLAT1, ODTLAT2 and ODTLAT3 to the ODT driving signals ENODT1, ENODT2 and ENODT3.

An operation of the conventional semiconductor memory device will be described briefly.

The input detecting unit 11 activates the period entry signal ODTENB when one of the ODT setting signals ODT1, ODT2 and ODT3 is activated. When the period entry signal ODTENB is activated, the input detecting unit 10 outputs the external clock CLK as the driving clock CLKODT.

The termination determining unit 13 is enabled in response to the activation of the Period entry signal ODTENB and counts the driving clock CLKODT to generate the period close signal CLKODTB indicating a predetermined timing when the ODT is disabled.

The DLL clock supplying unit 15 supplies the delayed DLL clocks RCLKDLP10, RCLKDLP20, FCLKDLP15 and RCLKDLP25 in response to the period entry signal ODTENB, and interrupts the supply of the delayed DLL clocks RCLKDLP10, RCLKDLP20, FCLKDLP15 and RCLKDLP25 in response to the activation of the DLL disable signal CLKODTB. The clocks RCLKDLP10, RCLKDLP20, FCLKDLP15 and RCLKDLP25 are generated by delaying the DLL clock.

The driving signal generating unit 17 receives the ODT setting signals ODT1, ODT2 and ODT3 in synchronization with the external clock CLK in response to the activation of the external ODT signal ODT, and outputs the pre-driving signals ODTLAT1, ODTLAT2 and ODTLAT3 in synchronization with the delayed DLL clocks RCLKDLP10, RCLKDLP20, FCLKDLP15 and FCLKDLP25.

The signal outputting unit 19 drives the pre-driving signals ODTLAT1, ODTLAT2 and ODTLAT3 to the ODT driving signals ENODT1, ENODT2 and ENODT3.

The data pre-driver 20 receives the falling data DT_F and the rising data DT_R to output the pull-up data DT_UP and the pull-down data DT_DN in synchronization with the external falling clock FCLK and the external rising clock RCLK.

The data output buffer 30 applies the termination resistances corresponding to the ODT driving signals ENODT1, ENODT2 and ENODT3 into the corresponding pads, and drives data corresponding to the pull-up data DT_UP and the pull-down data DT_DN to corresponding pads.

Whether the termination resistance is supplied or not is determined by detecting a voltage level difference between the corresponding pads.

FIG. 2 is a graph illustrating a voltage level variation of the pad when the termination resistance is supplied to the pad in the semiconductor memory device of FIG. 1.

It can be seen from FIG. 2 that a voltage level in an ODT operating state B, where the termination resistance is supplied, is lower than a voltage level in a floating state A, where no termination resistance is supplied. Due to the supply of the termination resistance, the voltage level of the pad, i.e., a pin, is dropped.

Therefore, whether the termination resistance is normally supplied or not is determined by detecting the voltage drop of the pads. This is because the control for termination resistance cannot be visually verified in the design.

As the range of the external voltage becomes narrow, the range of the voltage drop also becomes narrow and thus the detection of the voltage drop is difficult. Further, when the malfunction should be practically corrected in a design, its measurement is impossible and it cannot be corrected promptly. Thus, it will take a lot of time to analyze a defective device.

SUMMARY OF THE INVENTION

Embodiments of the present invention are directed to providing a semiconductor memory device, which can determine whether the control for supplying termination resistances is normally performed or not by applying a test signal.

In accordance with an aspect of the invention, there is provided a semiconductor memory device, which includes a termination resistance driving controller configured to receive a plurality of termination resistance setting signals in synchronization with an external clock and a delay locked loop (DLL) clock to output a plurality of pre-driving signals and a plurality of termination resistance driving signals for a predetermined time, a data pre-driver configured to output data in synchronization with the external clock, a test driving detector configured to drive output data nodes to a predetermined voltage level in response to a test signal and the plurality of pre-driving signals, and a data output buffer configured to apply termination resistances corresponding to the plurality of termination resistance driving signals to input/output pads, and output the data from the output data nodes to the input/output pads.

In accordance with an aspect of the invention, there is provided a semiconductor memory device, which includes a termination resistance driving controller configured to receive a plurality of termination resistance setting signals in synchronization with an external clock and a delay lock loop (DLL) clock to output a plurality of termination resistance driving signals for a predetermined time, a data pre-driver configured to output data in synchronization with the external clock, a test driving detector configured to drive output node of to a predetermined voltage level in response to a test signal and the plurality of termination resistance driving signals, and a data output buffer configured to apply termination resistances corresponding to the plurality of termination resistance driving signals to input/output pads, and output data from the output nodes to the input/output pads.

DESCRIPTION OF SPECIFIC EMBODIMENTS

Hereinafter, a semiconductor memory device in accordance with the present invention will be described in detail with reference to the accompanying drawings.

Figure 1:
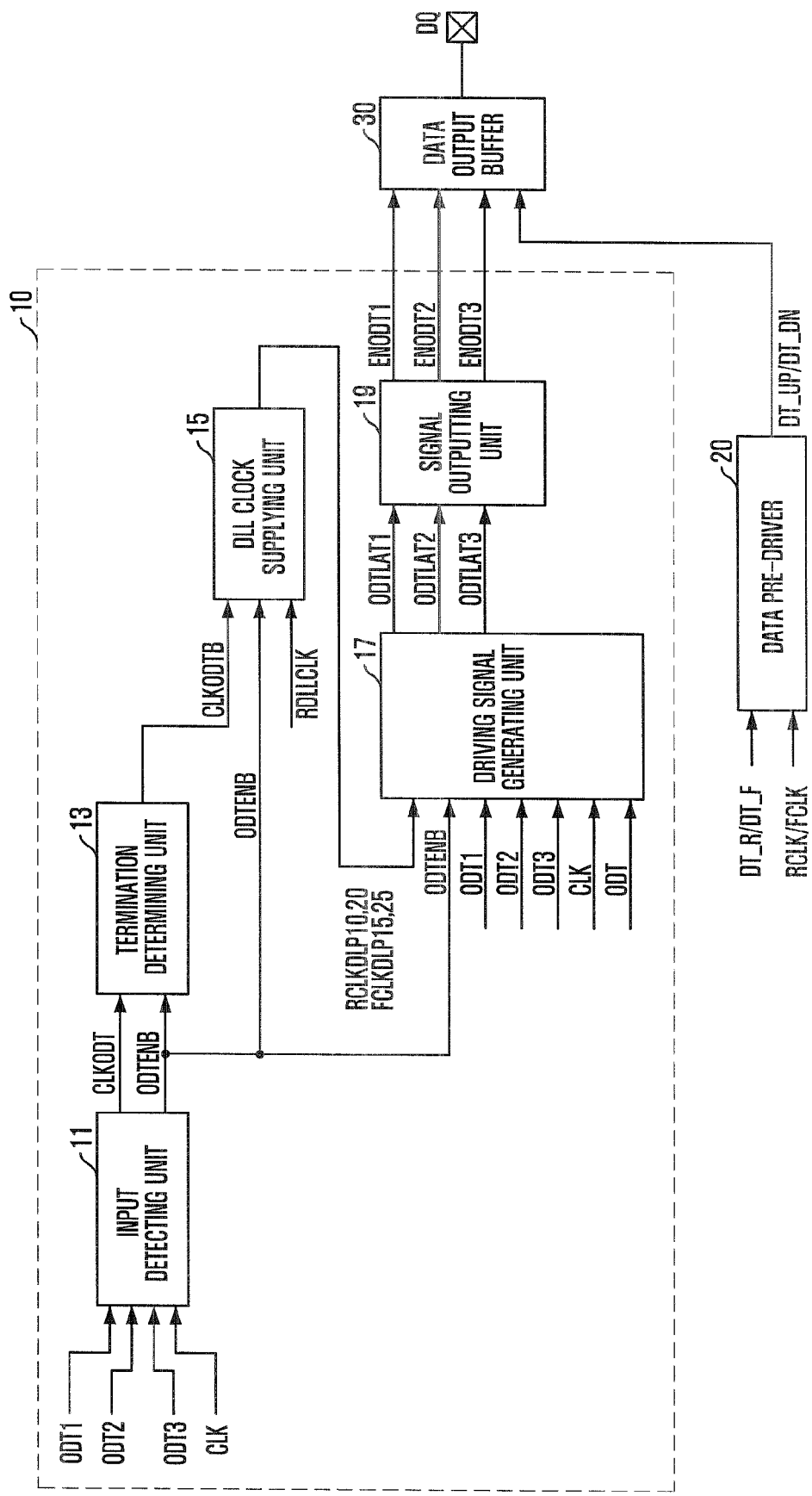
FIG. 1 is a block diagram of a conventional semiconductor memory device with an ODT circuit.
Figure 2:
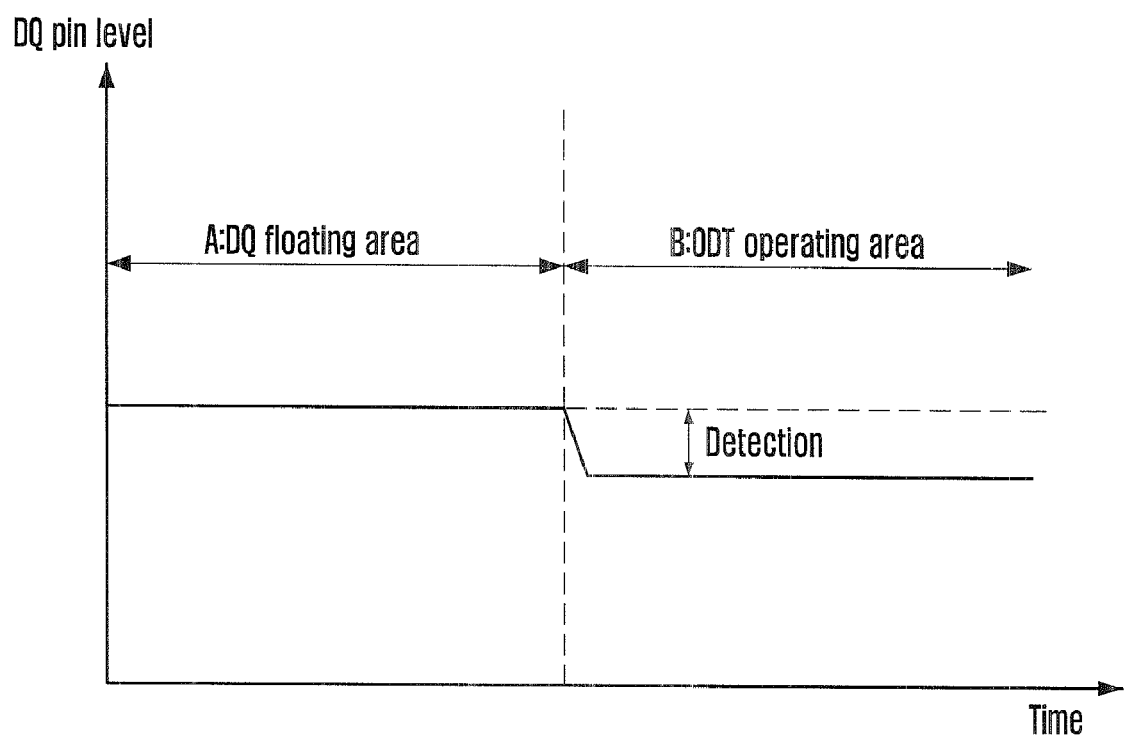
FIG. 2 is a graph illustrating a voltage level variation of a pad when the termination resistance is supplied to the pad in the semiconductor memory device of FIG. 1.
Figure 3:
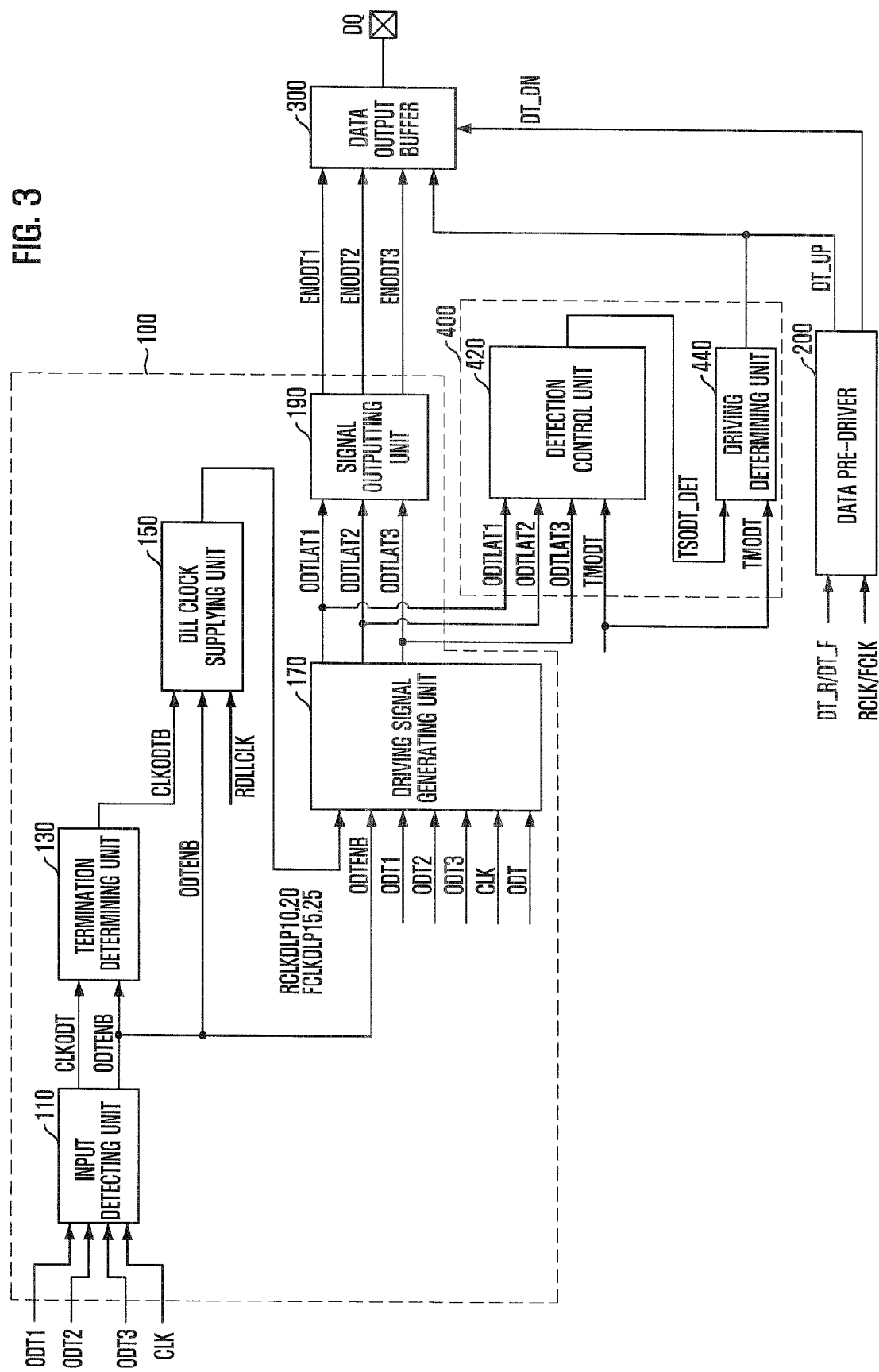
FIG. 3 is a block diagram of a semiconductor memory device in accordance with an embodiment of the present invention.

FIG. 3 is a block diagram of a semiconductor memory device in accordance with an embodiment of the invention.

Referring to FIG. 3, the semiconductor memory device includes an ODT driving controller 100, a data pre-driver 200, a data output buffer 300, and a test driving detector 400. The ODT driving controller 100 receives a plurality of ODT setting signals ODT1, ODT2 and ODT3 in synchronization with an external clock CLK and a DLL clock RDLLCLK to output a plurality of pre-driving signals ODTLAT1, ODTLAT2 and ODTLAT3 and a plurality of ODT driving signals ENODT1, ENODT2 and ENODT3 for a predetermined time. The data pre-driver 200 receives falling data DT_F and rising data DT_R to output pull-up data DT_UP and pull-down data DT_DN in synchronization with an external falling clock FCLK and an external rising clock RCLK. The test driving detector 400 pull-down drives a pull-up data supply node SN in response to a test signal TMODT and the pre-driving signals ODTLAT1, ODTLAT2 and ODTLAT3. The data output buffer 300 applies termination resistances corresponding to the ODT driving signals ENODT1, ENODT2 and ENODT3 into corresponding pads, e.g., a data I/O pad DQ, and drives data corresponding to the pull-up data DT_UP and the pull-down data DT_DN to corresponding pads DQ.

The ODT driving controller 100 includes an input detecting unit 110, a termination determining unit 130, a DLL clock supplying unit 150, a driving signal generating unit 170, and a signal outputting unit 190. The input detecting unit 110 receives the ODT setting signals ODT1, ODT2 and ODT3 and the external clock CLK to generate a period entry signal ODTENB and a driving clock CLKODT. The termination determining unit 130 counts the driving clock CLKODT for a predetermined time in response to the activation of the period entry signal ODTENB to generate a period close signal CLKODTB. The DLL clock supplying unit 150 supplies a plurality of delayed DLL clocks RCLKDLP10, RCLKDLP20, FCLKDLP15 and FCLKDLP25 in response to the period entry signal ODTENB and interrupts the supply of the delayed DLL clocks RCLKDLP10, RCLKDLP20, FCLKDLP15 and FCLKDLP25 in response to the period close signal CLKODTB. The driving signal generating unit 170 receives the ODT setting signals ODT1, ODT2 and ODT3 in synchronization with the external clock CLK in response to the activation of an external ODT signal ODT, and outputs a plurality of pre-driving signals ODTLAT1, ODTLAT2 and ODTLAT3 in synchronization with the delayed DLL clocks RCLKDLP10, RCLKDLP20, FCLKDLP15 and FCLKDLP25. The signal outputting unit 190 outputs the pre-driving signals ODTLAT1, ODTLAT2 and ODTLAT3 as the ODT driving signals ENODT1, ENODT2 and ENODT3.

The test driving detector 400 includes a detection control unit 420 and a driving determining unit 440. The detection control unit 420 outputs a detection control signal TSODT_DET in response to the test signal TMODT and the pre-driving signals ODTLAT1, ODTLAT2 and ODTLAT3. The driving determining unit 440 pull-down drives the pull-up data supply node SN in response to the test mode TMODT and the detection control signal TSODT_DET.

The test driving detector 400 can be driven by the ODT driving signals ENODT1, ENODT2 and ENODT3 instead of the pre-driving signals ODTLAT1, ODTLAT2 and ODTLAT3.

The ODT setting signals ODT1, ODT2 and ODT3 are signals inputted to a mode register set (MRS) for setting the termination resistances.

As described above, the semiconductor memory device further includes the test driving detector 400 that pull-down drives the pull-up data supply node SN in response to the pre-driving signals ODTLAT1, ODTLAT2 and ODTLAT3 when the test signal TMODT is inputted. Therefore, if the control for supplying the termination resistances is normally performed, a logic high level is detected at the pad when the test signal TMODT is inputted. Since the voltage level of the pad is relatively higher than that of the floating state, it is easy to detect the voltage level even though the voltage level of the external voltage is low. Further, since the voltage level can be detected by applying the test signal, the designer can obtain the feedback quickly, reducing the product development time.

Figure 4:
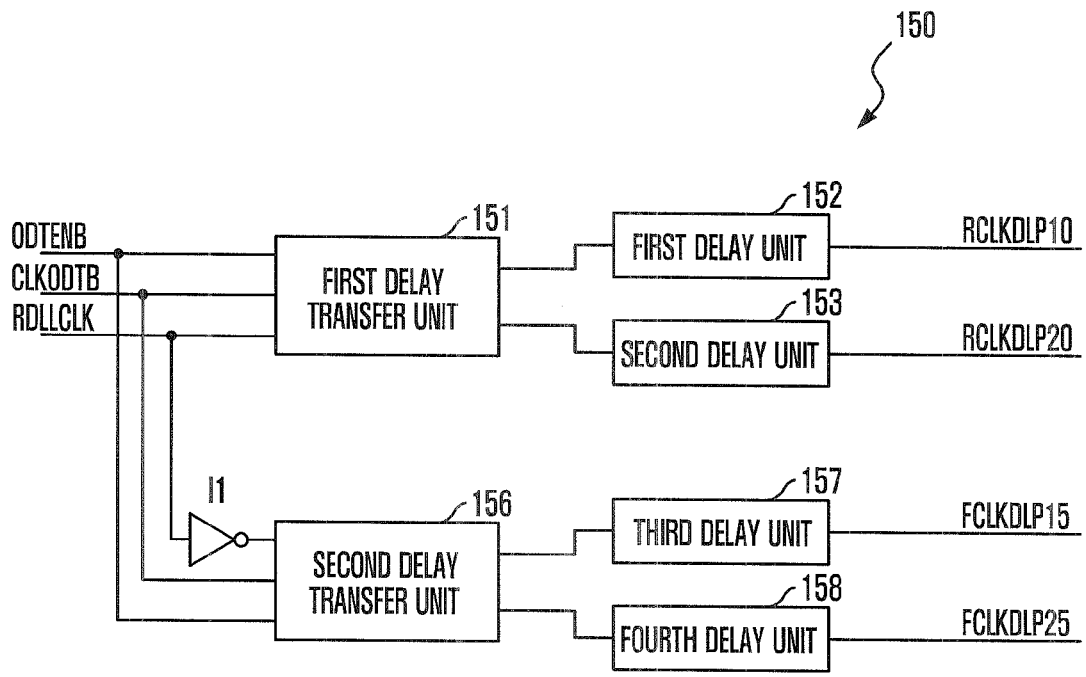
FIG. 4 is a block diagram of a DLL clock supplying unit illustrated in FIG. 3.

FIG. 4 is a block diagram of the DLL clock supplying unit 150 illustrated in FIG. 3.

Referring to FIG. 4, the DLL clock supplying unit 150 includes a first delay transfer unit 151, a first delay unit 152, a second delay unit 153, an inverter I1, a second delay transfer unit 156, a third delay unit 157, and a fourth delay unit 158. The first delay transfer unit 151 delays and transfers the DLL clock RDLLCLK in response to the period entry signal ODTENB and blocks the transfer of the DLL clock RDLLCLK in response to the period close signal CLKODTB. The first delay unit 152 delays an output signal of the first delay transfer unit 151 to output a first delayed DLL clock RCLKDLP10. The second delay unit 153 delays the output signal of the first delay transfer unit 151 to output a second delayed DLL clock RCLKDLP20. The inverter I1 inverts the DLL clock RDLLCLK. The second delay transfer unit 156 delays and transfers an output signal of the inverter I1 and blocks the transfer of the output signal of the inverter I1 in response to the period close signal CLKODTB. The third delay unit 157 delays and output signal of the second delay transfer unit 156 to output a third delayed DLL clock FCLKDLP15. The fourth delay unit 158 delays the output signal of the second delay transfer unit 156 to output a fourth delayed DLL clock FCLKDLP25.

Upon operation of the DLL clock supplying unit 150, the first and second delay transfer units 151 and 156 transfer the DLL clock RDLLCLK and its inverted clock in response to the period entry signal ODTENB. At this point, the pulse width of the transferred DLL clock is reduced.

The first to fourth delay units 152, 153, 157 and 158 delay their input signals for a predetermined time to output the delayed DLL clocks RCLKDLP10, RCLKDLP20, FCLKDLP15 and RCLKDLP25.

When the period close signal CLKODTB is activated, the first and second delay transfer units 151 and 156 are disabled. In this case, the delayed DLL clocks RCLKDLP10, RCLKDLP20, FCLKDLP15 and FCLKDLP25 also are not outputted from the first to fourth delay units 152, 153, 157 and 158.

Herein, the DLL clock RDLLCLK represents a rising DLL clock, and the first to fourth delay units 152, 153, 157 and 158 have different delay values from each other.

Figure 5:
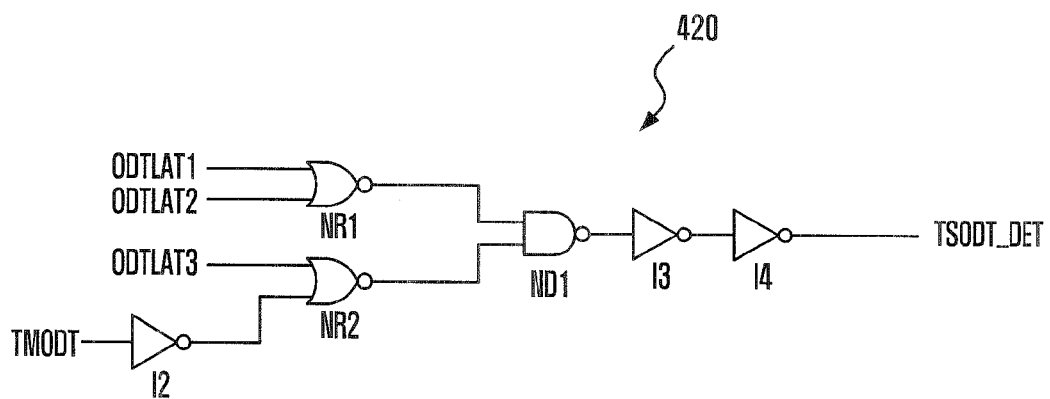
FIG. 5 is a circuit diagram of a detection control unit illustrated in FIG. 3.

FIG. 5 is a circuit diagram of the detection control unit 420 illustrated in FIG. 3.

Referring to FIG. 5, the detection control unit 420 includes a first NOR gate NR1 configured to receive the pre-driving signals ODTLAT1 and ODTLAT2, a first inverter I2 configured to invert the test signal TMODT, a second NOR gate NR2 configured to receive the pre-driving signal ODTLAT3 and an output signal of the inverter I2, a first NAND gate ND1 configured to receive output signals of the first and second NOR gates NR1 and NR2, a second inverter I3 configured to invert an output signal of the first NAND gate ND1, and a third inverter I4 configured to invert an output signal of the second inverter I3 to output the detection control signal TSODT_DET.

The detection control unit 420 activates the detection control signal TSODT_DET to a logic high level when any one of the pre-driving signals ODTLAT1, ODTLAT2 and ODTLAT3 and the test signal TMODT is activated.

Figure 6:
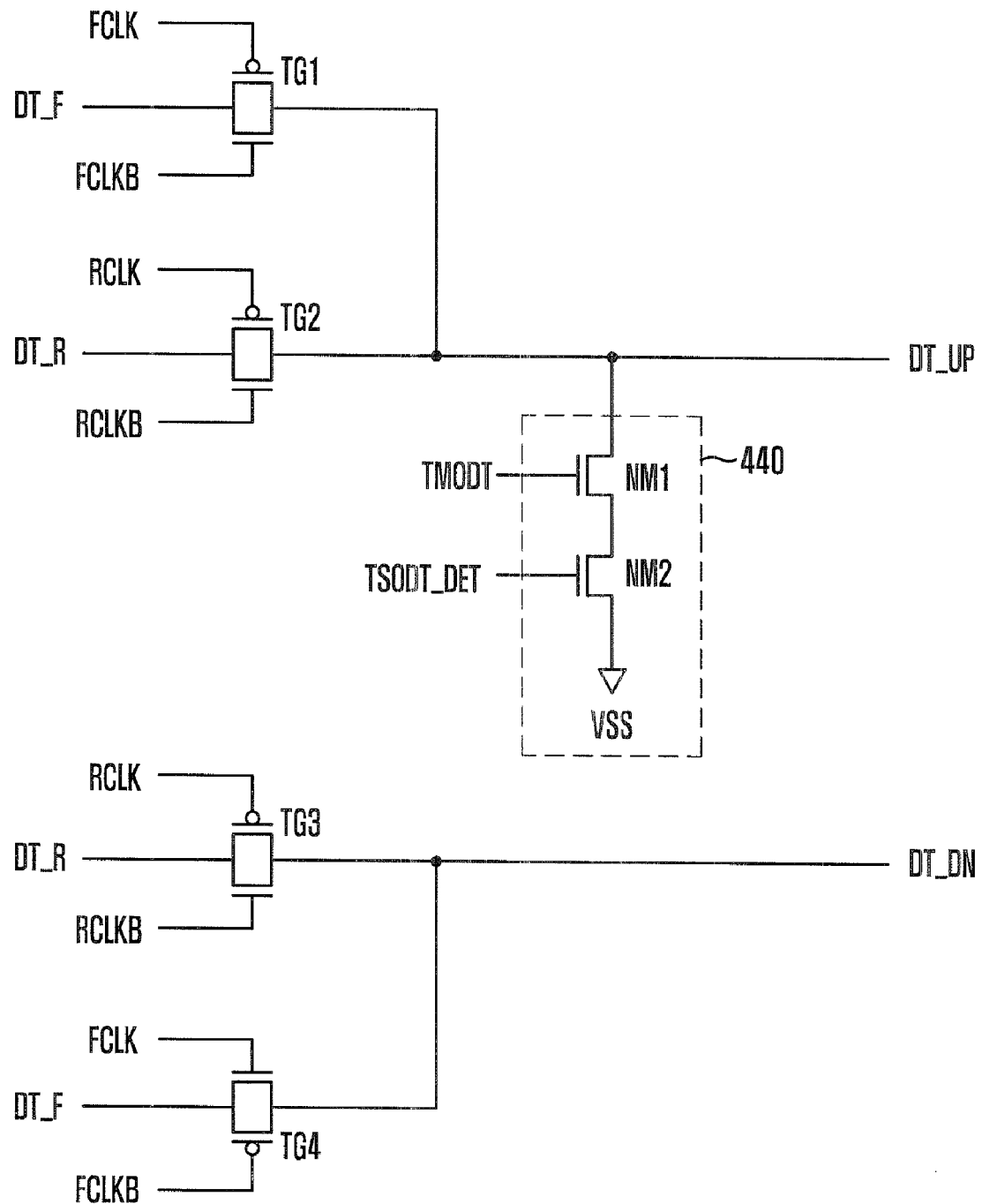
FIG. 6 is a circuit diagram of a driving determining unit and a data pre-driver illustrated in FIG. 3.

FIG. 6 is a circuit diagram of the driving determining unit 440 and the data pre-driver 200 illustrated in FIG. 3.

Referring to FIG. 6, the data pre-driver 200 includes first to fourth transistors. The first transfer gate TG1 transfers the falling data DT_F in synchronization with the external falling clock FCLK as the pull-up data DT_UP. The second transfer gate TG2 transfers the rising data DT_R in synchronization with the external rising clock RCLK as the pull-up data DT_UP. The third transfer gate TG3 transfers the falling data DT_F in synchronization with the external falling clock FCLK as the pull-down data DT_DN. The transfer gate TG4 transfers the rising data DT_R in synchronization with the external rising clock RCLK as the pull-down data DT_DN.

The driving determining unit 440 includes NMOS transistors NM1 and NM2. The first NMOS transistor NM1 has a drain connected to a pull-up data line and a gate receiving the test signal TMODT. The second NMOS transistor NM2 has a drain connected to a source of the first NMOS transistor NM1, a source connected to a ground terminal, and a gate receiving the detection control signal TSODT_DET.

The data pre-driver 200 outputs the pull-up data DT_UP and the pull-down data DT_DN by synchronizing the falling data DT_F with the external falling clock FCLK, and outputs the pull-up data DT_UP and the pull-down data DT_DN by synchronizing the rising data DT_R with the external rising clock RCLK.

When the test signal TMODT and the detection control signal TSODT_DET are activated to the logic high level, the first and second NMOS transistors NM1 and NM2 of the driving determining unit 440 are activated to pull-down drive the pull-up data line. That is, when the test signal TMODT and the detection control signal TSODT_DET are activated, the pull-up data DT_UP are outputted with a logic low level, regardless of the rising data DT_R and the falling data DT_F.

The driving determining unit 440 may include a PMOS transistor for pull-up driving the pull-down data supply node in response to logic low level of the test signal TMODT and the detection control signal TSODT_DET. In this case, inverters are further provided for inverting the test signal TMODT and the detection control signal TSODT_DET. When the test signal TMODT is inputted, the pull-down data DT_DN has a logic high level due to the pull-up operation of the driving determining unit 440. Therefore, the logic low level is detected through the corresponding pad.

An operation of the semiconductor memory device in accordance with the embodiment of the invention will be described below with reference to FIGS. 3 to 6. Specifically, the following description will be focused on the test mode where the test signal TMODT is inputted for determining whether the control for supplying the termination resistances is normally performed or not.

The input detecting unit 110 activates the period entry signal ODTENB when any one of the ODT setting signals ODT1, ODT2 and ODT3 is activated, and outputs the external clock CLK as the driving clock CLKODT when the period entry signal ODTENB is activated.

The termination determining unit 130 is enabled in response to the activation of the period entry signal ODTENB, and counts the driving clock CLKODT to output the period close signal CLKODTB indicating a predetermined timing when the ODT is disabled.

The DLL clock supplying unit 150 supplies the delayed DLL clocks RCLKDLP10, RCLKDLP20, FCLKDLP15 and FCLKDLP25 in response to the period entry signal ODETENB, and interrupts the transfer of the delayed DLL clocks RCLKDLP10, RCLKDLP20, FCLKDLP15 and FCLKDLP25 in response to the period close signal CLKODTB.

When the external ODT signal ODT is activated, the driving signal generating unit 170 receives the ODT setting signals ODT1, ODT2 and ODT3 in synchronization with the external clock CLK and outputs the pre-driving signals ODTLAT1, ODTLAT2 and ODTLAT3 in synchronization with the delayed DLL clocks RCLKDLP10, RCLKDLP20, FCLKDLP15 and FCLKDLP25.

The signal outputting unit 190 outputs the pre-driving signals ODTLAT1, ODTLAT2 and ODTLAT3 to the ODT driving signals ENODT1, ENODT2 and ENODT3.

When any one of the pre-driving signals ODTLAT1, ODTLAT2 and ODTLAT3 and the test signal TMODT is activated, the detection control unit 420 activates the detection control signal TSODT_DET to a logic high level.

The NMOS transistors NM1 and NM2 of the driving determining unit 440 are turned on in response to the detection control signal TSODT_DET and the test signal TMODT and pull-down drives the pull-up data supply line. That is, when the test signal TMODT and the detection control signal TSODT_DET are activated, the pull-up data DT_UP of a logic low level is outputted, regardless of the rising data DT_R and the falling data DT_F.

The data output buffer 300 outputs a logic high level in response to the pull-up data DT_UP.

Figure 7:
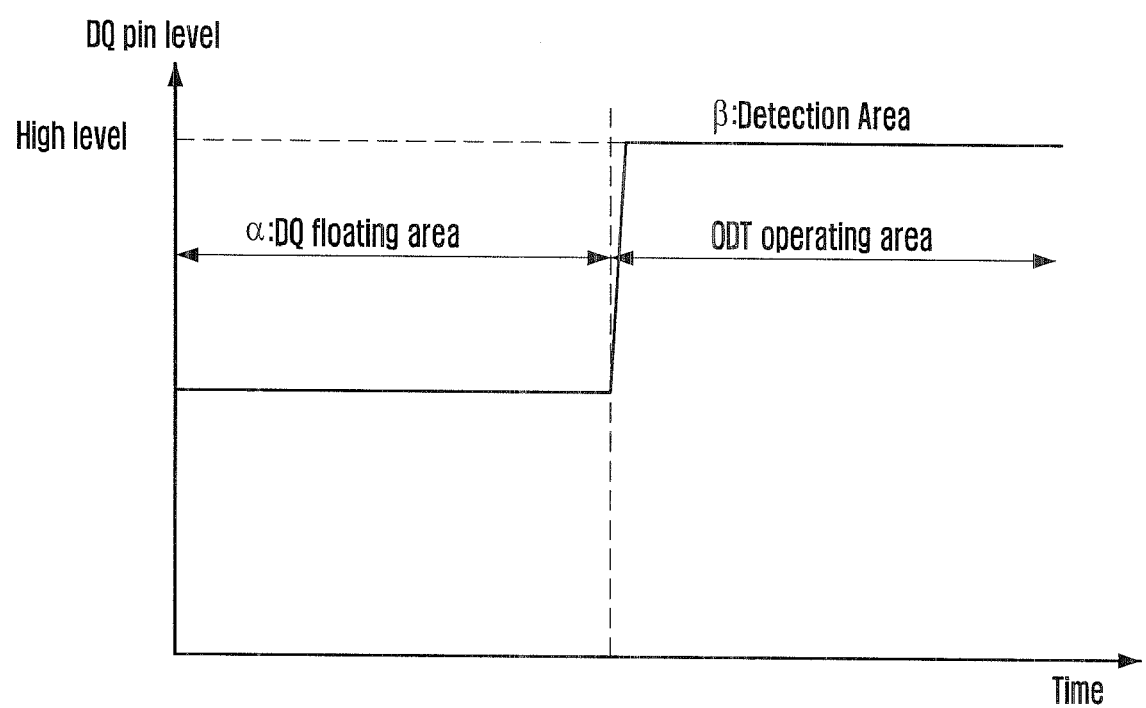
FIG. 7 is a graph illustrating a variation of a voltage level detected at a pad in a test mode.

FIG. 7 is a graph illustrating a variation of a voltage level detected at a pad in a test mode.

It can be seen from FIG. 7 that a voltage level in a floating state α, where no termination resistance is supplied, is lower than a voltage level in an ODT operating state β, where the termination resistance is supplied. This is because a logic high level is outputted through the pad by forcibly applying the logic low level to the pull-up data DT_UP in a test mode.

As described above, the semiconductor memory device further includes the test driving detector 400 that pull-down drives the node supplying the pull-up data DT_UP in response to the pre-driving signals ODTLAT1, ODTLAT2 and ODTLAT3 when the test signal TMODT is inputted. Therefore, if the control for supplying the termination resistances is normally performed, a logic high level is detected at the pad when the test signal TMODT is inputted. Since the voltage level of the pad is relatively higher than that of the floating state, it is easy to detect the voltage level even though the voltage level of the external voltage is low. Further, since the voltage level can be detected by applying the test signal, the designer can obtain the feedback quickly, reducing the product development time.

Further, the test ODT driving detector can receive the ODT driving signals instead of the pre-driving signals and obtain the same effect.

Moreover, the test time and production time of the semiconductor memory devices can be reduced because whether the control for supplying the termination resistances is normally performed can be determined by applying the test signal.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a termination resistance driving controller configured to receive a plurality of termination resistance setting signals in synchronization with an external clock and a delay locked loop (DLL) clock to output a plurality of pre-driving signals and a plurality of termination resistance driving signals for a predetermined time;
   a data pre-driver configured to output data in synchronization with the external clock;
   a test driving detector configured to drive output data nodes to a predetermined voltage level in response to a test signal and the plurality of pre-driving signals; and
   a data output buffer configured to apply termination resistances corresponding to the plurality of termination resistance driving signals to input/output pads, and to output the data from the output data nodes to the input/output pads.

2. The semiconductor memory device as recited in claim 1, wherein the test driving detector includes:
   a detection control unit configured to output a detection control signal in response to the test signal and the plurality of pre-driving signals; and
   a driving determining unit configured to pull-down drive a pull-up data supply node of the output data nodes in response to the test signal and the detection control signal.

3. The semiconductor memory device as recited in claim 2, wherein the driving determining unit includes:
   a first NMOS transistor configured to have a drain connected to the pull-up data supply node and a gate receiving the test signal; and
   a second NMOS transistor configured to have a drain connected to a source of the first NMOS transistor, a source connected to a ground terminal, and a gate receiving the detection control signal.

4. The semiconductor memory device as recited in claim 1, wherein the test driving detector includes:
   a detection control unit configured to output a detection control signal in response to the test signal and the plurality of pre-driving signals; and
   a driving determining unit configured to pull-up drive a pull-down data supply node of the output data nodes in response to the test signal and the detection control signal.

5. The semiconductor memory device as recited in claim 4, wherein the driving determining unit includes:
- a first inverter configured to invert the test signal;
- a first PMOS transistor configured to have a source connected to the pull-down data supply node and a gate receiving an output signal of the first inverter;
- a second inverter configured to invert the detection control signal; and
- a second PMOS transistor configured to have a source connected to a drain of the first PMOS transistor, a drain connected to a ground terminal, and a gate receiving an output signal of the second inverter.

6. The semiconductor memory device as recited in claim 2 wherein the detection control unit includes:
- a first NOR gate configured to receive a first pre-driving signal and a second pre-driving signal;
- a first inverter configured to invert the test signal;
- a second NOR gate configured to receive a third pre-driving signal and an output signal of the first inverter;
- a NAND gate configured to receive an output signal of the first NOR gate and an output signal of the second NOR gate;
- a second inverter configured to invert an output signal of the NAND gate; and
- a third inverter configured to invert an output signal of the second inverter to output the detection control signal.

7. The semiconductor memory device as recited in claim 1, wherein the termination resistance driving controller includes:
- an input detecting unit configured to receive the plurality of termination resistance setting signals and the external clock to output a period entry signal and a driving clock;
- a termination determining unit configured to count the driving clock in response to the activation of the period entry signal for the predetermined time to output a period close signal;
- a DLL clock supplying unit configured to supply a plurality of delayed DLL clocks in response to the period entry signal, and interrupt the supply of the delayed DLL clocks in response to the period close signal;
- a driving signal generating unit configured to receive the plurality of termination resistance setting signals in synchronization with the external clock when an external termination resistance signal is activated, and output the plurality of pre-driving signals in synchronization with the plurality of delayed DLL clocks; and
- a signal outputting unit configured to output the plurality of pre-driving signals as the plurality of termination resistance driving signals.

8. The semiconductor memory device as recited in claim 7, wherein the data pre-driver includes:
- a first transfer gate configured to transfer falling data of the data in synchronization with an external falling clock as pull-up data;
- a second transfer gate configured to transfer rising data of the data in synchronization with an external rising clock as the pull-up data;
- a third transfer gate configured to transfer the falling data in synchronization with the external falling clock as pull-down data; and
- a fourth transfer gate configured to transfer the rising data in synchronization with the external rising clock as the pull-down data.

9. The semiconductor memory device as recited in claim 8, wherein the DLL clock supplying unit includes:
- a first delay transfer unit configured to delay and transfer the DLL clock in response to the period entry signal, and block the transfer of the DLL clock in response to the period close signal;
- a first delay unit configured to delay an output signal of the first delay transfer unit to output a first delayed DLL clock;
- a second delay unit configured to delay the output signal of the first delay transfer unit to output a second delayed DLL clock;
- a first inverter configured to invert the DLL clock;
- a second delay transfer unit configured to delay and transfer an output signal of the first inverter in response to the period entry signal, and block the transfer of the output signal of the first inverter in response to the period close signal;
- a third delay unit configured to delay an output signal of the second delay transfer unit to output a third delayed DLL clock; and
- a fourth delay unit configured to delay the output signal of the second delay transfer unit to output a fourth delayed DLL clock.

10. A semiconductor memory device, comprising:
- a termination resistance driving controller configured to receive a plurality of termination resistance setting signals in synchronization with an external clock and a delay lock loop (DLL) clock to output a plurality of termination resistance driving signals for a predetermined time;
- a data pre-driver configured to output data in synchronization with the external clock;
- a test driving detector configured to drive output nodes to a predetermined voltage level in response to a test signal and the plurality of termination resistance driving signals; and
- a data output buffer configured to apply termination resistances corresponding to the plurality of termination resistance driving signals to input/output pads, and output data from the output nodes to the input/output pads.

11. The semiconductor memory device as recited in claim 10, wherein the test driving detector includes:
- a detection control unit configured to output a detection control signal in response to the test signal and the plurality of termination resistance driving signals; and
- a driving determining unit configured to pull-down drive a pull-up data supply node of the output nodes in response to the test signal and the detection control signal.

12. The semiconductor memory device as recited in claim 11, wherein the driving determining unit includes:
- a first NMOS transistor having a drain connected to the pull-up data supply node and a gate receiving the test signal; and
- a second NMOS transistor having a drain connected to a source of the first NMOS transistor, a source connected to a ground terminal, and a gate receiving the detection control signal.

13. The semiconductor memory device as recited in claim 10, wherein the test driving detector includes:
- a detection control unit configured to output a detection control signal in response to the test signal and the plurality of termination resistance driving signals; and
- a driving determining unit configured to pull-up drive a pull-down data supply node of the output nodes in response to the test signal and the detection control signal.

14. The semiconductor memory device as recited in claim 13, wherein the driving determining unit includes:
- a first inverter configured to invert the test signal;
- a first PMOS transistor having a source connected to the pull-down data supply node and a gate receiving an output signal of the first inverter;
- a second inverter configured to invert the detection control signal; and
- a second PMOS transistor having a source connected to a drain of the first PMOS transistor, a drain connected to a ground terminal, and a gate receiving an output signal of the second inverter.

15. The semiconductor memory device as recited in claim 11 wherein the detection control unit includes:
- a first NOR gate configured to receiving first and second termination resistance driving signals;
- a first inverter configured to invert the test signal;
- a second NOR gate configured to receive a third termination resistance driving signal and an output signal of the first inverter;
- a NAND gate configured to receive an output signal of the first NOR gate and an output signal of the second NOR gate;
- a second inverter configured to invert an output signal of the NAND gate; and
- a third inverter configured to invert an output signal of the second inverter to output the detection control signal.

16. The semiconductor memory device as recited in claim 10, wherein the termination resistance driving controller includes:
- an input detecting unit configured to receive the plurality of termination resistance setting signals and the external clock to output a period entry signal and a driving clock;
- a termination determining unit configured to count the driving clock in response to the activation of the period entry signal for the predetermined time to output a period close signal;
- a DLL clock supplying unit configured to supply a plurality of delayed DLL clocks in response to the period entry signal, and interrupt the supply of the delayed DLL clocks in response to the period close signal; and
- a driving signal generating unit configured to receive the plurality of termination resistance setting signals in synchronization with the external clock when an external termination resistance signal is activated, and generate the plurality of termination resistance driving signals in synchronization with the plurality of delayed DLL clocks.

17. The semiconductor memory device as recited in claim 16, wherein the data pre-driver includes:
- a first transfer gate configured to transfer falling data of the data in synchronization with an external falling clock as pull-up data;
- a second transfer gate configured to transfer rising data of the data in synchronization with an external rising clock as the pull-up data;
- a third transfer gate configured to transfer the falling data of the data in synchronization with the external falling clock as pull-down data; and
- a fourth transfer gate configured to transfer the rising data of the data in synchronization with the external rising clock as the pull-down data.

* * * * *